United States Patent [19]

Lundberg

[11] Patent Number: 5,281,869
[45] Date of Patent: Jan. 25, 1994

[54] REDUCED-VOLTAGE NMOS OUTPUT DRIVER

[75] Inventor: James R. Lundberg, Austin, Tex.

[73] Assignee: Digital Equipment Corporation, Maynard, Mass.

[21] Appl. No.: 907,402

[22] Filed: Jul. 1, 1992

[51] Int. Cl.$^5$ .......................................... H03K 19/003
[52] U.S. Cl. .................... 307/443; 307/448; 307/451
[58] Field of Search ............... 307/443, 448, 451, 475, 307/296.5

[56] References Cited

U.S. PATENT DOCUMENTS

| | | | |
|---|---|---|---|
| 3,839,646 | 10/1974 | Soloway | 307/448 |
| 4,275,313 | 6/1981 | Boll et al. | 307/448 |
| 4,345,172 | 8/1982 | Kobayashi et al. | 307/448 X |
| 4,347,447 | 8/1982 | Proebsting | 307/448 X |
| 4,782,250 | 11/1986 | Adams et al. | 307/473 |
| 4,825,106 | 4/1989 | Tipon et al. | 307/451 |
| 4,963,766 | 10/1990 | Lundberg | 307/451 |
| 5,160,855 | 11/1992 | Dobberpuhl | 307/443 X |
| 5,172,016 | 12/1992 | Dobberpuhl | 307/475 |

Primary Examiner—David R. Hudspeth
Attorney, Agent, or Firm—Arnold, White & Durkee

[57] ABSTRACT

A tri-state output buffer circuit employs N-channel pull-up and pull-down transistors, with another N-channel transistor connected between the pull-up and pull-down transistors and having its gate connected to the low-voltage supply. An output node at one side of the pull-up transistor may be driven to a voltage higher than the supply, without subjecting the pull-up to hot-carrier effects or other deleterious effects of over-voltage. When in the high-impedance output state, the gate of the pull-up is shorted to an intermediate node which is the drain of the pull-down transistor, using a P-channel and an N-channel transistor responsive to the logic input. The voltage on the gate of the pull-up transistor is allowed to track the output up to the reduced voltage supply minus $V_{TN}$ when in the high-impedance state, by tying the gate of the pull-up transistor to the intermediate node; this prevents damage to the pull-up due to hot-carrier effects.

20 Claims, 1 Drawing Sheet

REDUCED-VOLTAGE NMOS OUTPUT DRIVER

BACKGROUND OF THE INVENTION

This invention relates to output buffer circuits for semiconductor integrated circuit devices, and more particularly to a circuit having a low-voltage power supply and using N-channel output driver transistors.

In the manufacture of CMOS integrated circuit devices, as feature sizes continue to shrink, it has become necessary to reduce the power supply (e.g., to 3.3 V) in some devices to preclude damage due to hot carrier effects. However, it is still necessary to be able to interface to other chips using higher voltages (e.g., 5 V). The output buffer circuits employed in chips using 3.3 V supplies must therefore be able to withstand 5 V levels applied to the terminals of the chip. Three problems exist with traditional push-pull CMOS bi-directional output buffers when they are powered by a reduced power supply and, in the high-impedance output state (referred to as the Z-state), must receive higher levels. First, when a bi-directional output drives low coming out of the Z-state from an elevated voltage, an output NMOS pull-down transistor can suffer hot carrier effects. A commonly-used solution for this hot carrier problem is to cascode two NMOS devices (i.e., another N-channel transistor in series with the pull-down) with the gate of the top device biased to the reduced power supply. The second problem is that when a bi-directional output in Z-state is driven above the 3.3 V power supply by a diode drop (and hence the well bias), the drain junction diode of the output PMOS pull-up transistor will forward bias, injecting carriers into the well and posing potential reliability problems. And third, when the output in Z-state is driven a PMOS threshold drop above the reduced power supply, the output PMOS pull-up transistor will turn on, sinking current into the reduced power supply of the chip. Prior circuit techniques exist to solve the last two of these problems; however, they all pay a penalty in performance, chip area, and power due to added parasitics and increased gate area. One of these solutions is to isolate the PMOS pull-up transistor from the output node using a series NMOS transistor with the 3.3 V supply on its gate; this solution is undesirable since the PMOS pull-up device must be inordinately large to achieve acceptable performance. It is thus desirable to use an uncascoded NMOS pull-up transistor to eliminate the above encumbrances. However, an NMOS output pull-up would be subjected to gate oxide stress when, in Z-state, the gate of the NMOS output pull-up transistor is at zero volts and the output node is driven to 5 Volts. Also an output NMOS pull-up transistor would be subjected to body effect when driving and cannot, thus, drive to the 3.3 V rail. This poses the problem of adequate noise margin at $V_{oh}$ for TTL levels.

An example of a CMOS output buffer circuit using a P-channel pull-up transistor is disclosed in my U.S. Pat. No. 4,963,766, assigned to Digital Equipment Corporation. This circuit is adapted to be powered by a low-voltage supply, e.g., 3.3 v., but yet is able to withstand higher voltages imposed on its output node. A P-channel pull-up transistor is employed, and the N-well of this pull-up transistor is connected to the higher-level voltage supply, e.g., 5.0-volts.

Another example of a CMOS output buffer circuit using a P-channel pull-up transistor is illustrated in U.S. Pat. No. 4,782,250. The N-well of the P-channel pull-up transistor is biased. An N-channel pass transistor in series with the N-channel pull-down device to avoid undue gate oxide stress on the pull-down when the output voltage exceeds the 3.3 V supply. Two cascoded P-channel devices are used for the pull-up. In Z-state, the gate of the P-channel transistor farthest from the pad and the N-well will track the output when the output exceeds the reduced power supply by $V_{Tp}$.

SUMMARY OF THE INVENTION

In accordance with one embodiment of the invention, a tri-state output buffer circuit uses an N-channel output pull-up transistor, instead of a P-channel device as shown in my U.S. Pat. No. 4,963,766. Unique circuitry is employed for driving and controlling the output pull-up and pull-down transistors to eliminate the hot carrier effects and gate oxide stress. This circuit provides a unique solution for interfacing to elevated voltages that does not inhibit performance, increase power, or increase chip area-problems associated with interfacing a P-channel pull-up transistor (and its corresponding well) to elevated voltages. The buffer circuit is capable of driving TTL-level thresholds with adequate $V_{oh}$ noise margin when driving from the end of a transmission line environment with high impedance receivers.

In particular, a tri-state output buffer circuit employs N-channel pull-up and pull-down transistors, with another N-channel transistor connected between the pull-up and pull-down transistors and having its gate connected to the low-voltage supply. An output node at one side of the pull-up transistor may be driven to a voltage higher than the supply, without subjecting the pull-up to hot-carrier effects or other deleterious effects of over-voltage. When in the high-impedance output state, the gate of the pull-up is shorted to an intermediate node which is the drain of the pull-down transistor, using a P-channel and an N-channel transistor responsive to the logic input. When in the high-impedance state, the voltage on the gate of the pull-up transistor is allowed to track the output voltage up to the low-voltage supply minus $V_{TN}$; this prevents damage to the pull-up due to over-voltage effects.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DETAILED DESCRIPTION OF SPECIFIC EMBODIMENT

Figure 1:
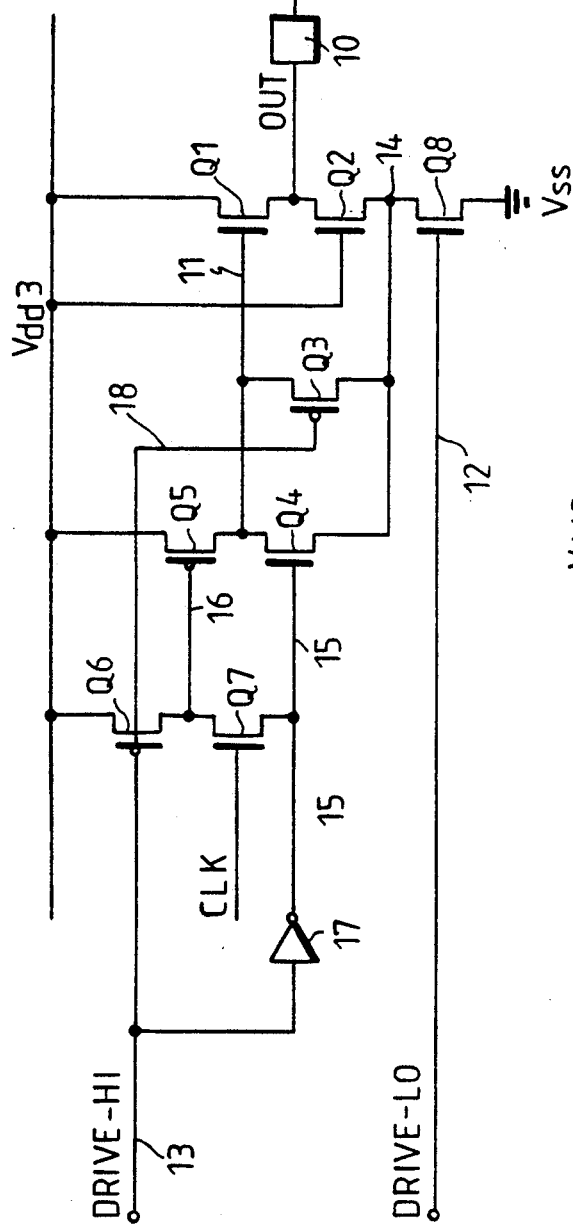
FIG. 1 is an electrical diagram of an output buffer circuit according to one embodiment of the invention.

Referring to FIG. 1, a tri-state output buffer circuit is illustrated according to one embodiment of the invention. The circuit output is a set of three N-channel transistors Q1, Q2 and Q8 having their source-to-drain paths connected in series between a low-voltage supply $Vdd_3$ (typically 3.3 V) and ground terminal Vss. The object is to drive an output pad 10 using the low voltage supply, but yet allow the pad 10 to be driven by another chip having a 5-volt supply, without sinking current into the $Vdd_3$ supply or subjecting the pull-down or pull-up transistor to any over-voltage effects. The pad 10 may function as a bidirectional I/O pad, in which case it would be connected to an input buffer on the chip (with input protection devices) not shown in FIG. 1. In the output buffer circuit, the transistor Q1 functions as a pull-up transistor, and the transistor Q8 functions as a pull-down. For the high impedance output state (the Z-state), the gate of transistor Q8 is held low, while the gate of Q1 tracks the output node up to $Vdd_3$ minus $V_{TN}$, thus keeping Q1 off. For drive-high or drive-low, the gates 11 and 12 are driven in opposition, one being high and the other low, so if the circuit input is in one logic state the transistor Q1 is on and the transistor Q8 is off, or vice versa if the circuit input is in the other logic state. The transistor Q2 has the $Vdd_3$ voltage on its gate, as will be explained.

The Drive-Hi voltage on input 13 is applied to the gates of P-channel transistors Q6 and Q3, where Q3 is connected between the gate 11 of the pull-up transistor Q1 and an intermediate node 14 between the transistors Q2 and Q8. The inverse of Drive-Hi is applied via inverter 17 to the gate 15 of the N-channel transistor Q4, where Q4 is also connected between the gate 11 of the pull-up transistor Q1 and an intermediate node 14 between the transistors Q2 and Q8. The gate 11 is driven high or asserted by a P-channel transistor Q5 which is connected in series between the $Vdd_3$ supply and the node 14. The P-channel transistor Q6 is connected to a node 16 between the input P-channel transistor Q6 and a clocked N-channel transistor Q7.

The circuit of FIG. 1 has three basic modes of operation: the Z-state or high-impedance output state, the driving low state, and the driving high state. The driving high state is produced when the input Drive-Hi on line 13 is high and the input Drive-Lo on gate 12 is low, turning on the pull-up transistor Q1 and turning off the pull-down transistor Q8, holding the output pad 10 high. The driving low state is produced when the input Drive-Hi on line 13 is low and the input Drive-Lo is high, tying the gate 11 of Q1 to the intermediate node 14 and assuring Q1 is off, and turning on the pull-down transistor Q8 to hold the output pad 10 low. The high-impedance state is produced when both of the inputs Drive-Hi and Drive-Lo are low, at Vss, turning off pull-down transistor Q8 and turning off Q1 by tying its gate to node 14, so the pad 10 exhibits a high impedance. This Z-state is used when the pad 10 is used as an input pad, or when another chip is to be allowed to drive the bus to which the pad 10 is connected (with the chip containing the circuit of FIG. 1 being out of play); in either case the voltage applied to the pad 10 by another chip may be 5 V.

Figure 2:
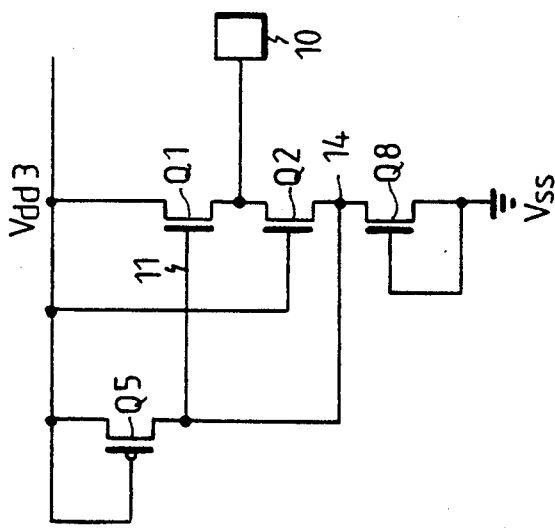
FIG. 2 is an electrical diagram of an equivalent for the circuit of FIG. 1 when in a high-impedance mode of operation.

The Z-state will be discussed first. When the Drive-Lo input 12 is deasserted (low), the transistor Q8 is shut off. The Drive-Hi input 13 is also deasserted (low), shutting off the transistor Q5, but turning on the transistor Q4 via invertor 17 and turning on the transistor Q3 via line 18. The gate 11 of the transistor Q1 is now tied to the output pad 10 via NMOS transistor Q2 (and Q3, Q4). The circuit of FIG. 1 in this mode essentially looks like FIG. 2. If the output pad 10 is driven low in this condition, the gate 11 of the NMOS output pull-up transistor Q1 exactly follows the output 10, keeping pull-up transistor Q1 off. Or, if the output 10 is driven high, the transistor Q1 follows the output 10 up to a threshold drop from 3.3 volts (the $Vdd_3$ voltage). The threshold drop is caused by body effect (Vtn-body) due to the NMOS transistor Q2. As this output level (3.3 volts minus Vtn-body) both Q2 and Q1 are off. Therefore, as the output level on pad 10 continues to rise there is a small amount of capacitive coupling between the output pad 10 and the gate 11 of the NMOS transistor Q1. This coupling keeps Q1 off as the output 10 goes even higher (since now $Vdd_3$ becomes the source of the NMOS transistor Q1, and the output 10 becomes the drain as the output exceeds $Vdd_3$). If the gate of the NMOS transistor Q1 exceeded the voltage $Vdd_3$ by a voltage greater than that of Vtn-body, the transistor Q1 could turn on. This however, cannot happen due to two factors: (1) the capacitance on the node at the gate 11 of Q1 is significantly higher than the overlap capacitance of transistor Q1 with respect to the output 10, thus reducing the magnitude of coupling, and (2) if the gate of transistor Q1 were to couple higher than $Vdd_3$, the PMOS transistor Q5 would turn on, limiting the voltage at the gate of the transistor Q1 to $Vdd_3$ plus Vtp, the threshold of a PMOS transistor. Since the threshold of the transistor Q1 is subject to body effect in this regime (Vtn is proportional to the square root of the NMOS source, $Vdd_3$ in this case, minus the NMOS bulk, or ground), the threshold of NMOS transistor Q1 is higher than when in the normal regime (source equals the bulk voltage level). Normally the magnitude of Vtp and Vtn are close, thus it would be expected that the magnitude of Vtn-body would be greater than Vtp. So, in this case the NMOS transistor Q1 would also remain off.

In the Z-state, when the output 10 is driven to 5.0 volts (or higher) by some external circuit, the gate 11 of the output pull-up transistor Q1 is close to $Vdd_3$. Thus, the transistor Q1 does not suffer any hot carrier or gate oxide stress effects. This is in contrast to prior circuits, where an output NMOS pull-up driver, in the Z-state, would have the same device deasserted with a gate voltage of zero volts, and thus the device could incur over-voltage damage under the same technology requiring a reduced power supply. Note further, that the transistor Q2 is the cascoded device that is required to protect the output pull-down transistor Q8; thus, the only extra device over a normal push-pull driver circuit is the PMOS transistor Q4, a relatively small PMOS pass transistor that serves to enhance the circuit but is not required.

The driving low situation will now be examined. Here the buffer circuit is actively driving the output 10 low by turning on the pull-down transistor Q8. The gate 11 of the NMOS pull-up transistor Q1 will be tied via NMOS transistor Q4 and PMOS transistor Q3 to the drain of the output pull-down transistor Q8. Thus, the gate of NMOS transistor Q1 will be less than or equal to the output 10 assuming the NMOS transistor Q1 remains off. The transistor Q1 will remain off throughout the entire low-going transition. With the Drive-Hi input 13 at a low voltage in this drive low condition, the transistor Q6 is on, holding the gate 16 high and transistor Q5 off; the transistor Q4 is held on by the inverted Drive-Hi voltage, and transistor Q3 is held on, clamping the gate 11 to the intermediate node 14.

The driving high condition is now examined. When the circuit of FIG. 1 is going to drive the output pad 10 high, the Drive-Lo line 12 is deasserted, shutting off the output pull-down NMOS transistor Q8. The Drive-Hi line 13 is asserted (high) shutting off transistors Q3, Q4, and Q6. When the clock input Clk goes high, transistor Q7 turns on, causing the gate of the PMOS transistor Q5 to go to zero volts, turning on the PMOS transistor Q5 and driving the gate 11 of the NMOS output pull-up transistor Q1 to 3.3 V, Vdd3. There are two regimes of operation based on the initial condition (either low or high) of the output pad 10.

If the output pad 10 was initially low, the transistor Q1 turns on and the circuit begins to drive high. Driving from the end of a transmission line with impedance Zo, the voltage level of the incident drive wave is dictated by the driver impedance, Rd (in this case the output NMOS pull-up transistor Q1). For a point-to-point transmission line environment with a high impedance load (as a CMOS, MOS, or TTL receiver) at the far end, the incident wave will double in amplitude sending back to the driver a reflected wave of the same amplitude as the incident wave. If the incident wave was Vdd/2, i.e., Rd=Zo, then the reflected wave will also equal Vdd/2. When the reflected wave returns to the driver, the voltage at the output pad 10 is Vdd (Vdd/2+Vdd/2). Since there is an NMOS pull-up transistor Q1, when the reflected wave returns the NMOS output pull-up transistor Q1, will shut off (Vds=Vgs=0). The output pad 10 will remain at Vdd, held by the capacitance of the loading. Proper sizing of the transistor Q1 can assure a driver impedance, Rd, of less than or equal to the module impedance, Zo, thus assuring the driver circuit is capable of driving to 3.3 V or above. Since the transistor Q1 is subject to body effect, the incident wave is limited to significantly less than Vdd, assuring that an incident wave approaching Vdd can not happen, and thus assuring that the final voltage level (when the incident wave doubles) will not be so high as to exceed a voltage sufficient to damage the driver. This environment assures that there is adequate noise margin to support TTL levels.

Note that when the reflected wave returns that the output driver now looks like a high impedance similar to Z-state. The output level is held by the capacitance of the loading (the transmission line environment and the receiving loads). Thus, there is the potential for a module or external coupling event to bring the output voltage level down (or up, but that is not of interest). However, in any transmission line environment, coupling events are separated in time due to the propagation delay (based on the dielectric of the module) of the transmission line. Even if a line were being actively driven by a conflicting low impedance driver, the driver cannot respond to the coupling event for a discrete period of time based on the transmission line distance from the event. Therefore, regardless of the driver type, capacitive coupling must be limited to assure proper TTL thresholds. In the case of this output NMOS pull-up, this rule is no exception. However, this driver enjoys the added benefit of being able to trickle charge onto the bus. That is to say, when a coupling event occurs of sufficient magnitude that the output NMOS pull-up can turn on, it will trickle charge onto the bus. As mentioned previously, this coupling event can not be of a magnitude sufficient to endanger TTL threshold levels. When the coupling event is over, the voltage will return to its steady state. Since charge has trickled on to the capacitive load, this state will be slightly elevated in voltage. This will continue (analogous to a charge pump) until the output voltage is sufficiently elevated such that the coupling event can no longer turn on the output NMOS pull-up transistor Q1.

If the initial state of the output was already high prior to driving, the same situation occurs.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

What is claimed is:

1. An output circuit, comprising:
    a) a pull-down transistor and a pull-up transistor, each of said transistors having a source-to-drain path and a gate; the source-to-drain path of said pull-up transistor being connected between a voltage supply and an output node; the source-to-drain path of said pull-down transistor being connected between a reference terminal and an intermediate node;
    b) a first transistor having a source-to-drain path and a gate, the source-to-drain path of said first transistor being connected between said output node and said intermediate node; the gate of said first transistor being connected to said supply;
    c) logic input means for said circuit coupling separate logic inputs to said gates of said pull-down and pull-up transistors;
    d) switching means to couple said gate of said pull-up transistor to said intermediate node in response to a logic input to said pull-up transistor being of a selected value.

2. A circuit according to claim 1 including means for holding said gate of said pull-up transistor at about the voltage of said supply when said separate logic input to said gate of said pull-up transistor is at a selected value.

3. A circuit according to claim 2 wherein said means for holding is a second transistor having a source-to-drain path connected between said supply and said gate of said pull-up transistor.

4. A circuit according to claim 1 wherein said pull-up and pull-down transistors and said first transistor are of the same channel-conductivity type.

5. A circuit according to claim 4 wherein said channel-conductivity type is N-channel.

6. A circuit according to claim 4 wherein said switching means is a transistor of a channel-conductivity type opposite that of said pull-up and pull-down transistors.

7. A circuit according to claim 1 wherein said logic input means applies a drive-high input, a drive-low input, or a high-impedance input to said gates of said pull-up and pull-down transistors, to drive said output node to a high level, a low level or a high-impedance level, respectively; and wherein said switching means includes a second transistor turned on when said high-impedance input is applied by said logic input means.

8. A circuit according to claim 7 wherein said pull-up, pull-down and first transistors are N-channel and said second transistor is P-channel; and including a third and a fourth P-channel transistor, the third transistor having a source-to-drain path connected between said supply and a gate of said fourth transistor, the fourth transistor having a source-to-drain path connected between said supply and said gate of said pull-up transistor, the gate of said third transistor being connected to receive said input for said pull-up transistor.

9. A circuit according to claim 8 including a fifth N-channel transistor having a source-to-drain path connected between said gate of said pull-up transistor and said intermediate node, and having a gate connected by an invertor to said input for said pull-up transistor.

10. A driver circuit, comprising:
 a) first, second and third transistors, each of said transistors having a source-to-drain path and a gate;
 b) the source-to-drain path of the first transistor being connected between a first terminal of a voltage supply and an output node; the source-to-drain path of the second transistor being connected between a second terminal of said voltage supply and an intermediate node; the source-to-drain path of the third transistor being connected between said intermediate node and said output node; the gate of said third transistor being connected to said first terminal of said voltage supply;
 c) logic input means for said driver circuit applying separate inputs to said gates of said first and second transistors;
 d) a fourth transistor having a source-to-drain path connected between said gate of said first transistor and said intermediate node and having a gate responsive to said logic input means.

11. A circuit according to claim 10 wherein said first, second and third transistors are of one channel conductivity type and said fourth transistor is of another channel conductivity type.

12. A circuit according to claim 11 wherein said one channel conductivity type is N-channel and said another channel conductivity type is P-channel.

13. A circuit according to claim 10 wherein said logic input means applies a drive-high input, a drive-low input, or a high-impedance input to said gates of said first and second transistors, to drive said output node to a high level, a low level or a high-impedance level, respectively.

14. A circuit according to claim 13 wherein said fourth transistor is turned on when said high-impedance input is applied by said logic input.

15. A circuit according to claim 14 wherein said first, second and third transistors are N-channel and said fourth transistor is P-channel.

16. A circuit according to claim 15 including a fifth and a sixth P-channel transistor, the fifth transistor having a source-to-drain path connected between said first terminal and a gate of said sixth transistor, the sixth transistor having a source-to-drain path connected between aid first terminal and said gate of said first transistor, the gate of said fifth transistor being connected to receive said input for said first transistor.

17. A circuit according to claim 16 including a seventh N-channel transistor having a source-to-drain path connected between said gate of said first transistor and said intermediate node, and having a gate connected by an invertor to said input for said first transistor.

18. A circuit according to claim 17 including an eighth transistor having a source-to-drain path connected between said gate of said fifth transistor and said gate of said seventh transistor and having a gate connected to a clock voltage source.

19. A circuit comprising: an output node; a pull-up transistor having a gate and having a source-to-drain path connecting said output node to a source of voltage of a given value; logic means driving said gate with logic voltage; a coupling transistor having a source-to-drain path connecting said output node to an intermediate node and having a gate connected to said source of voltage; and switching means connecting said gate of said pull-up transistor to said intermediate node in response to a selected value of said logic voltage.

20. A circuit according to claim 19 wherein said pull-up transistor and said coupling transistor are N-channel and said switching means is a P-channel transistor.

* * * * *